(12) United States Patent
Liu et al.

(10) Patent No.: US 11,481,076 B2
(45) Date of Patent: Oct. 25, 2022

(54) TRANSIMPEDANCE AMPLIFIER (TIA)-BASED GLOBAL COARSE BASELINE CORRECTION (GCBC) FOR CAPACITIVE SENSING

(71) Applicant: Synaptics Incorporated, San Jose, CA (US)

(72) Inventors: Chunbo Liu, San Jose, CA (US); Selim Guncer, San Diego, CA (US); Osman Emir Erol, San Jose, CA (US); Jonathan Ku, Campbell, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 74 days.

(21) Appl. No.: 17/141,483

(22) Filed: Jan. 5, 2021

(65) Prior Publication Data
US 2022/0214765 A1 Jul. 7, 2022

(51) Int. Cl.
| *G01D 5/241* | (2006.01) |
| *H03F 3/45* | (2006.01) |
| *G06F 3/044* | (2006.01) |

(52) U.S. Cl.
CPC ........... *G06F 3/0443* (2019.05); *G01D 5/241* (2013.01); *H03F 3/45475* (2013.01); *H03F 2203/45528* (2013.01)

(58) Field of Classification Search
None
See application file for complete search history.

(56) References Cited

U.S. PATENT DOCUMENTS

| 2012/0268145 | A1* | 10/2012 | Chandra | G06F 3/04166 324/686 |
| 2015/0293636 | A1* | 10/2015 | Park | G06F 3/0418 345/173 |
| 2017/0141787 | A1* | 5/2017 | Bacchu | H03M 3/322 |
| 2017/0212619 | A1* | 7/2017 | Sharma | G06F 3/0416 |
| 2021/0200374 | A1* | 7/2021 | Yuan | G06F 3/0418 |

* cited by examiner

*Primary Examiner* — Duane N Taylor, Jr.
(74) *Attorney, Agent, or Firm* — Paradice & Li LLP

(57) ABSTRACT

A method and apparatus of global coarse baseline correction (GCBC) for capacitive scanning. An input device may include a number (N) of sensor electrodes, a GCBC circuit, and detection circuitry. Each sensor electrode is associated with a respective channel. The GCBC circuit produces sensing signals in each of the N channels and the detection circuitry may detect changes in the capacitances of one or more sensor electrodes based on the sensing signals. In some implementations, the GCBC circuit may include a current source which outputs a first current, a transimpedance amplifier (TIA) which converts the first current to a sensing voltage, and a number (N) of resistors that can be coupled between the output of the TIA and the N sensor electrodes, respectively. The coupling of each resistor between the TIA and a respective sensor electrode produces a sensing signal in the channel associated with the sensor electrode.

20 Claims, 9 Drawing Sheets

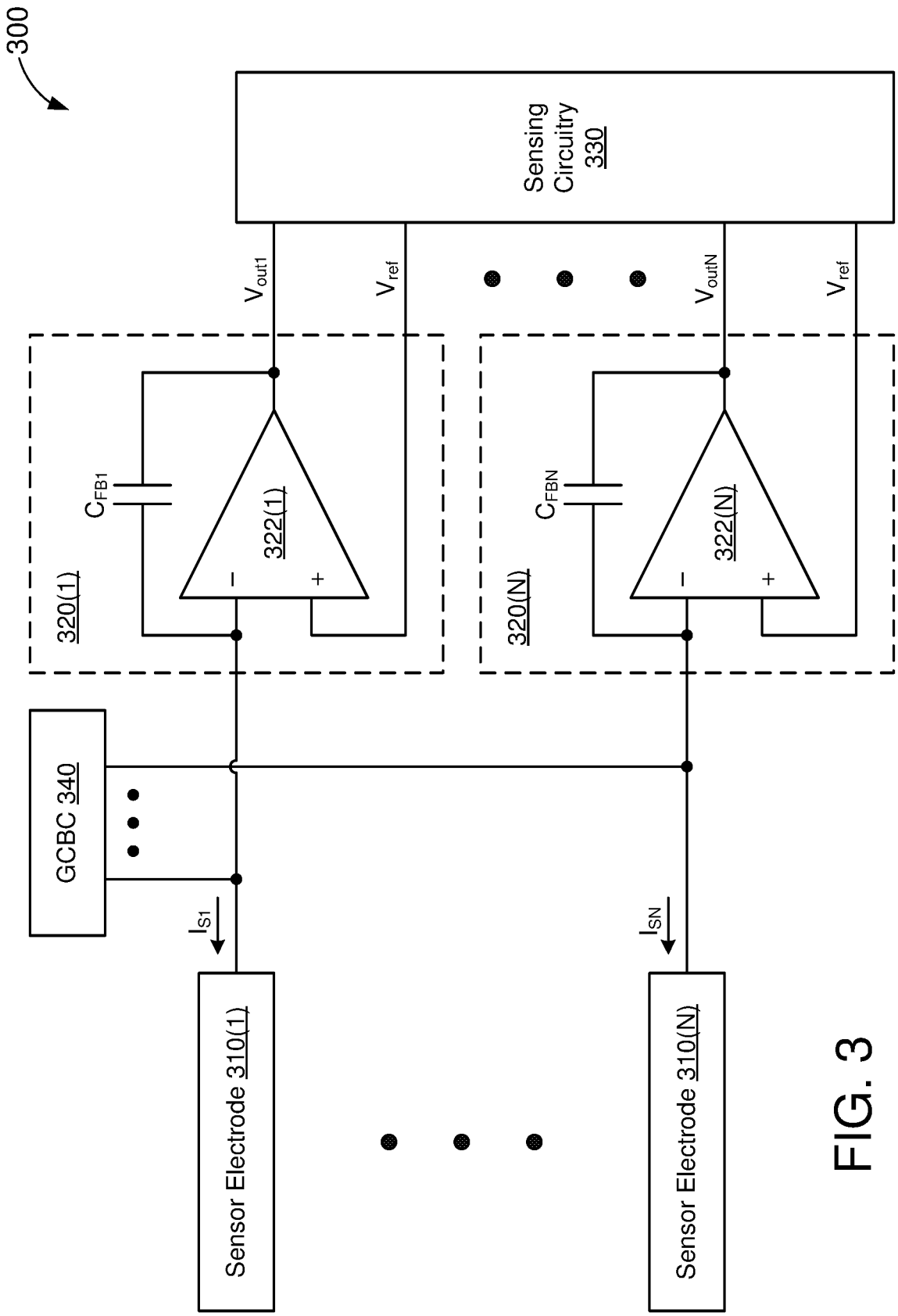

TRANSIMPEDANCE AMPLIFIER (TIA)-BASED GLOBAL COARSE BASELINE CORRECTION (GCBC) FOR CAPACITIVE SENSING

TECHNICAL FIELD

The present implementations relate generally to capacitive sensing, and specifically to transimpedance amplifier (TIA)-based global coarse baseline correction (GCBC) for capacitive sensing.

BACKGROUND OF RELATED ART

Input devices including proximity sensor devices (also commonly referred to as touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

Proximity sensors may operate by detecting changes in a capacitance of the sensing region. For example, the sensing region may include a number of conductors (also referred to as "sensor electrodes") that can be configured to transmit and/or receive electric signals. The signals can be used to measure a capacitive coupling between a sensor electrode and an input object (such as in sensing techniques based on self-capacitance) or between a pair of sensor electrodes (such as in sensing techniques based on mutual capacitance). A "baseline" represents the expected capacitance of a sensor electrode when no external objects are present in the sensing region. Objects in contact with (or close proximity to) the sensing region may cause the effective capacitance of a sensor electrode to deviate from its baseline. Accordingly, the baseline must be filtered or otherwise accounted for to detect the presence or position of an input object.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method and apparatus for baseline correction in capacitive sensing is disclosed. One innovative aspect of the subject matter of this disclosure can be implemented in an input device including a first sensor electrode, a current source, a transimpedance amplifier, a first resistor, and a controller. The current source is configured to output a first current. The transimpedance amplifier is configured to receive the first current from the current source and produce a first voltage based on the first current. The first resistor is configured to provide a second current to the first sensor electrode based at least in part on the first voltage. The controller is configured to detect changes in a capacitance of the first sensor electrode based at least in part on the second current.

Another innovative aspect of the subject matter of this disclosure can be implemented in a method of capacitive sensing performed by an input device. The method includes steps of generating a first current; converting the first current, through a transimpedance amplifier, to a first voltage at a first node; selectively coupling a first resistor between the first node and a first sensor electrode based on an operating mode of the input device, where the operating mode is one of a first mode or a second mode; and detecting changes in a capacitance of the first sensor electrode based at least in part on a second current produced by the first resistor responsive to being coupled between the first node and the first sensor electrode.

Another innovative aspect of the subject matter of this disclosure can be implemented in a baseline correction circuit for an input device including a current source, a transimpedance amplifier, a second resistor, and switching circuitry. The current source is configured to produce a first current. The transimpedance amplifier is configured to receive the first current from the current source and produce a sensing voltage based on the first current, where the transimpedance amplifier includes an operational amplifier and a first resistor coupled between an input and an output of the operational amplifier. The second resistor has a first terminal coupled to the output of the operational amplifier, where the second resistor has the same temperature coefficient of resistance (TCR) as the first resistor. The switching circuitry is configured to selectively couple a second terminal of the second resistor to a sensor electrode of the input device so that a second current is produced across the second resistor, based on the sensing voltage, responsive to the second terminal being coupled to the sensor electrode.

BRIEF DESCRIPTION OF THE DRAWINGS

The present implementations are illustrated by way of example and are not intended to be limited by the figures of the accompanying drawings.

FIG. 3 shows a block diagram of an example input device according to some implementations.

DETAILED DESCRIPTION

Figure 1:
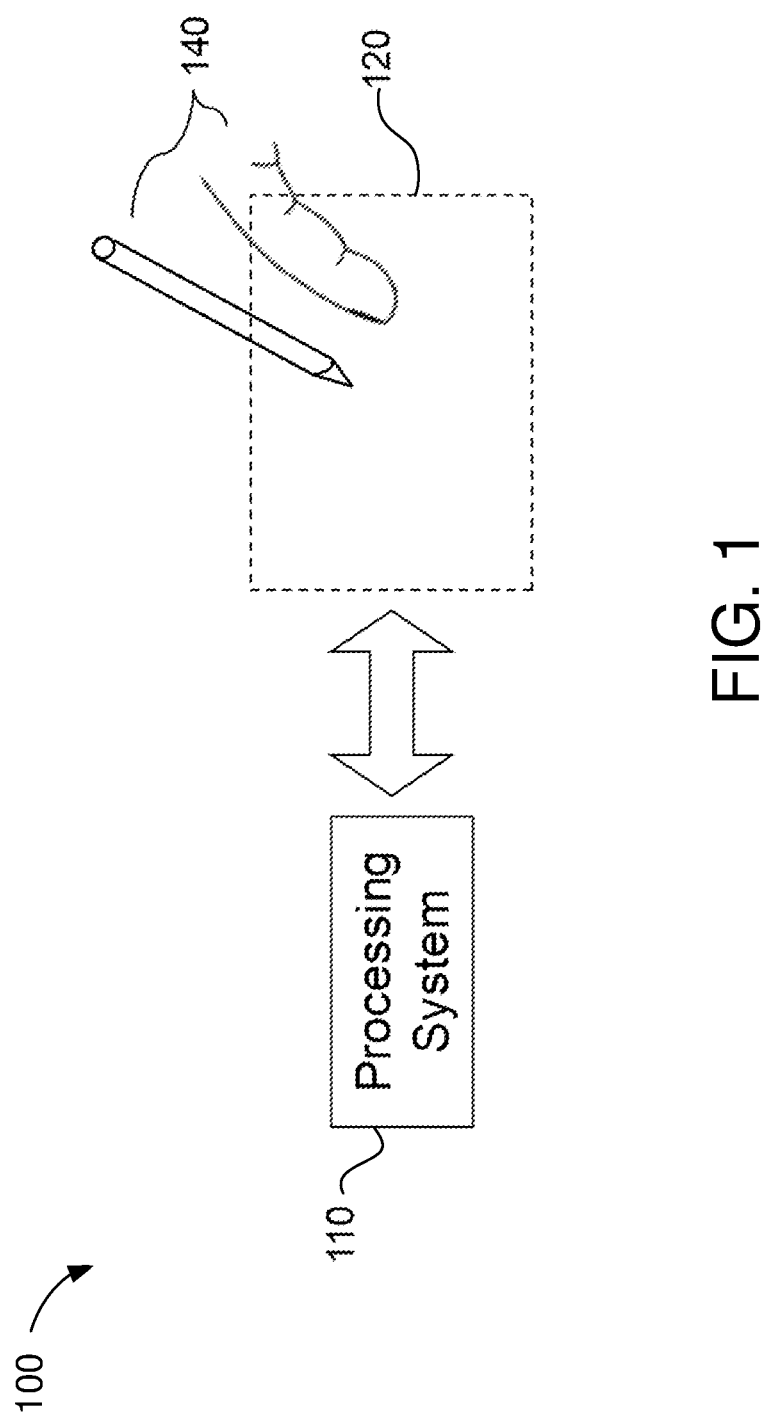
FIG. 1 shows an example input device which may be used with the present implementations.

Various implementations relate generally to input devices capable of capacitive sensing. Some implementations more specifically relate to global coarse baseline correction (GCBC) techniques for capacitive sensing. An input device may include a number (N) of sensor electrodes, a GCBC circuit, and detection circuitry. Each sensor electrode is associated with a respective "channel" of the input device.

The GCBC circuit produces sensing signals in each of the N channels and the detection circuitry may detect changes in the capacitances of one or more sensor electrodes based, at least in part, on the sensing signals. More specifically, each sensing signal may be configured to mitigate or cancel out a baseline capacitance associated with a respective one of the sensor electrodes, which improves the ability of the detection circuitry to detect minor variations in capacitance which can be caused by input objects in close proximity to the sensor electrode.

In some implementations, the GCBC circuit may include a current source configured to output a current ($I_{GCBC}$), a transimpedance amplifier (TIA) configured to convert the current $I_{GCBC}$ to a sensing voltage ($V_S$), and a number (N) of signal-producing (SP) resistors that can be coupled between the output of the TIA and the N sensor electrodes, respectively. The coupling of each SP resistor between the TIA and a respective sensor electrode produces a sensing signal (based on $V_S$) in the channel associated with the sensor electrode. The TIA may include an operational amplifier ("op-amp") and a feedback resistor coupled between an output of the op-amp and an input of the op-amp, in a negative feedback configuration. In some implementations, the feedback resistor may have the same temperature coefficient of resistance (TCR) as each of the SP resistors.

Particular implementations of the subject matter described in this disclosure can be implemented to realize one or more of the following potential advantages. The GCBC circuit of the present implementations may produce robust sensing signals that can be used to more accurately detect changes in the capacitances of sensor electrodes compared to existing GCBC techniques. For example, many existing GCBC circuits use current mirrors to copy or reproduce a sensing signal across multiple channels. Aspects of the present disclosure recognize that the transistors used in current mirrors are susceptible to flicker noise, which limits the achievable noise floor. In the present implementations, a sensing signal is produced in each channel by a respective SP resistor coupled to the output of a TIA. Unlike current mirrors, resistors are not susceptible to flicker noise.

Aspects of the present disclosure also recognize that current mirrors are sensitive to mismatches and exhibit drift in response to temperature changes (also referred to as "temperature drift"). In other words, changes in the temperature of the GCBC circuit may cause variations in the sensing signals produced by one or more current mirrors, which may affect the accuracy of capacitive sensing. In the present implementations, the TCR of each SP resistor is the same as the TCR of the feedback resistor of the TIA. As a result, temperature drift in each in each of the SP resistors is offset (or canceled out) by the temperature drift in the feedback resistor of the TIA. Accordingly, aspects of the present disclosure may reduce or eliminate various types of noise or interference (such as temperature drift and flicker noise) that would otherwise affect sensing signals produced by a GCBC circuit.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example implementations. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the implementations disclosed herein may be executed by one or more processors. The term "processor," as used herein may refer to any general-purpose processor, conventional processor, controller, microcontroller, special-purpose processor, and/or state machine capable of executing scripts or instructions of one or more software programs stored in memory.

FIG. 1 shows an example input device 100 within which the present implementations may be implemented. The input device 100 includes a processing system 110 and a sensing region 120. The input device 100 may be configured to provide input to an electronic system (not shown for simplicity). Examples of electronic systems may include personal computing devices (such as desktop computers, laptop computers, netbook computers, tablets, web browsers, e-book readers, and personal digital assistants (PDAs)), composite input devices (such as physical keyboards, joysticks, and key switches), data input devices (such as remote controls and mice), data output devices (such as display screens and printers), remote terminals, kiosks, video game machines (such as video game consoles, portable gaming devices, and the like), communication devices (such as cellular phones or smart phones), and media devices (such as recorders, editors, televisions, set-top boxes, music players, digital photo frames, digital cameras, and in-car entertainment systems).

In some aspects, the input device 100 may be implemented as a physical part of the corresponding electronic system. Alternatively, the input device 100 may be physically separated from the electronic system. The input device 100 may be coupled to (and communicate with) components of the electronic system using various wired and/or wireless interconnection and communication technologies, such as buses and networks. Examples technologies may include Inter-Integrated Circuit (I²C), Serial Peripheral Interface (SPI), PS/2, Universal Serial bus (USB), Bluetooth®, Infrared Data Association (IrDA), and various radio frequency (RF) communication protocols defined by the IEEE 802.11 standard.

In the example of FIG. 1, the input device 100 may correspond to a proximity sensor device (also referred to as a "touchpad" or "touch sensor device") configured to sense input provided by one or more input objects 140 in the sensing region 120. Example input objects 140 include fingers, styli, active pens, and the like. The sensing region 120 may encompass any space above, around, in, and/or proximate to the input device 100 in which the input device 100 is able to detect user input (such as provided by one or more input objects 140). The size, shape, and/or location of the sensing region 120 (relative to the electronic system) may vary depending on actual implementations.

In some implementations, the sensing region 120 may extend from a surface of the input device 100 in one or more directions in space, for example, until a signal-to-noise ratio (SNR) of the sensors falls below a threshold suitable for object detection. For example, the distance to which the sensing region 120 extends in a particular direction may be on the order of less than a millimeter, millimeters, centimeters, or more, and may vary with the type of sensing technology used and/or accuracy desired. In some implementations, the sensing region 120 may detect inputs involving no physical contact with any surfaces of the input device 100, contact with an input surface (such as a touch surface and/or screen) of the input device 100, contact with an input surface of the input device 100 coupled with some amount of applied force or pressure, and/or any combination thereof.

In some implementations, input surfaces may be provided by, and/or projected (as an image) on, one or more surfaces of a housing of the input device 100. For example, the sensing region 120 may have a rectangular shape when projected onto an input surface of the input device 100. In some aspects, inputs may be provided through images spanning one, two, three, or higher dimensional spaces in the sensing region 120. In some other aspects, inputs may be provided through projections along particular axes or planes in the sensing region 120. Still further, in some aspects, inputs may be provided through a combination of images and projections in the sensing region 120.

The input device 100 may utilize various sensing technologies to detect user input. Example sensing technologies may include capacitive, elastive, resistive, inductive, magnetic, acoustic, ultrasonic, and optical sensing technologies. In some implementations, the input device 100 may utilize capacitive sensing technologies to detect user inputs. For example, the sensing region 120 may include one or more capacitive sensing elements (such as sensor electrodes) to create an electric field. The input device 100 may detect inputs based on changes in capacitance of the sensor electrodes. For example, an object in contact with (or close proximity to) the electric field may cause changes in the voltage and/or current in the sensor electrodes. Such changes in voltage and/or current may be detected as "signals" indicative of user input. The sensor electrodes may be arranged in arrays or other configurations to detect inputs at multiple points within the sensing region 120. In some aspects, some sensor electrodes may be ohmically shorted together to form larger sensor electrodes. Some capacitive sensing technologies may utilize resistive sheets that provide a uniform layer of resistance.

Example capacitive sensing technologies may be based on "self-capacitance" (also referred to as "absolute capacitance") and/or "mutual capacitance" (also referred to as "transcapacitance"). Absolute capacitance sensing methods detect changes in the capacitive coupling between sensor electrodes and an input object. For example, an input object near the sensor electrodes may alter the electric field near the sensor electrodes, thus changing the measured capacitive coupling. In some implementations, the input device 100 may implement absolute capacitance sensing by modulating sensor electrodes with respect to a reference voltage and detecting the capacitive coupling between the sensor electrodes and input objects. The reference voltage may be substantially constant or may vary. In some aspects, the reference voltage may correspond to a ground potential.

Transcapacitance sensing methods detect changes in the capacitive coupling between sensor electrodes. For example, an input object near the sensor electrodes may alter the electric field between the sensor electrodes, thus changing the measured capacitive coupling of the sensor electrodes. In some implementations, the input device 100 may implement transcapacitance sensing by detecting the capacitive coupling between one or more "transmitter" sensor electrodes and one or more "receiver" sensor electrodes. Transmitter sensor electrodes may be modulated relative to the receiver sensor electrodes. For example, the transmitter sensor electrodes may be modulated relative to a reference voltage to transmit signals, while the receiver sensor electrodes may be held at a relatively constant voltage to "receive" the transmitted signals. The signals received by the receiver sensor electrodes may be affected by environmental interference (such as from other electromagnetic signals and/or objects in contact with, or in close proximity to, the sensor electrodes). In some aspects, each sensor electrode may either be a dedicated transmitter or a dedicated receiver. In other aspects, each sensor electrode may be configured to transmit and receive.

The processing system 110 may be configured to operate the hardware of the input device 100 to detect input in the sensing region 120. In some implementations, the processing system 110 may control one or more sensor electrodes to detect objects in the sensing region 120. For example, the processing system 110 may be configured to transmit signals via one or more transmitter sensor electrodes and receive signals via one or more receiver sensor electrodes. In some aspects, one or more components of the processing system 110 may be co-located, for example, in close proximity to the sensing elements of the input device 100. In some other aspects, one or more components of the processing system 110 may be physically separated from the sensing elements of the input device 100. For example, the input device 100 may be a peripheral coupled to a computing device, and the processing system 100 may be implemented as software executed by a central processing unit (CPU) of the computing device. In another example, the input device 100 may be physically integrated in a mobile device, and the processing system 110 may correspond, at least in part, to a CPU of the mobile device.

In some implementations, the processing system 110 may be implemented as a set of modules that are implemented in firmware, software, or a combination thereof. Example modules include hardware operation modules for operating hardware such as sensor electrodes and display screens; data processing modules for processing data such as sensor signals and positional information; and reporting modules for reporting information. In some implementations, the processing system 110 may include sensor operation modules configured to operate sensing elements to detect user input in the sensing region 120; identification modules configured to identify gestures such as mode changing gestures; and mode changing modules for changing operation modes of the input device 100 and/or electronic system.

The processing system 110 may respond to user input in the sensing region 120 by triggering one or more actions. Example actions include changing an operation mode of the input device 110 and/or graphical user interface (GUI) actions such as cursor movement, selection, menu navigation, and the like. In some implementations, the processing system 110 may provide information about the detected input to the electronic system (such as to a CPU of the electronic system). The electronic system may then process information received from the processing system 110 to carry out additional actions (such as changing a mode of the electronic system and/or GUI actions).

The processing system 110 may operate the sensing elements of the input device 100 to produce electrical signals indicative of input (or lack of input) in the sensing region 120. The processing system 110 may perform any appropriate amount of processing on the electrical signals to translate or generate the information provided to the electronic system. For example, the processing system 110 may digitize analog signals received via the sensor electrodes and/or perform filtering or conditioning on the received signals. In some aspects, the processing system 110 may subtract or otherwise account for a "baseline" associated with the sensor electrodes. For example, the baseline may represent a state of the sensor electrodes when no user input is detected. Accordingly, the information provided by the processing system 110 to the electronic system may reflect a difference between the signals received from the sensor electrodes and a baseline associated with each sensor electrode.

In some implementations, the processing system 110 may further determine positional information for a detected input. The term "positional information," as used herein, refers to any information describing or otherwise indicating a position or location of the detected input (such as within the sensing region 120). Example positional information may include absolute position, relative position, velocity, acceleration, and/or other types of spatial information.

In some implementations, the input device 100 may include a touch screen interface (such as a display screen) that at least partially overlaps the sensing region 120. For example, the sensor electrodes of the input device 100 may form a substantially transparent overlay on the display screen, thereby providing a touch screen interface for the associated electronic system. The display screen may be any type of dynamic display capable of displaying a visual interface to a user. Examples of suitable display screen technologies may include light emitting diode (LED), organic LED (OLED), cathode ray tube (CRT), liquid crystal display (LCD), plasma, electroluminescence (EL), or other display technology.

In some implementations, the input device 100 may share physical elements with the display screen. For example, one or more of the sensor electrodes may be used in displaying the interface and sensing inputs. More specifically, a sensor electrode used for sensing inputs may also operate as a display electrode used for displaying at least a portion of the interface. In some implementations, the input device 100 may include a first sensor electrode configured for displaying at least part of the interface and sensing inputs, and a second sensor electrode may be configured for input sensing only. For example, the second sensor electrode may be disposed between substrates of the display device or may be external to the display device.

In some aspects, the display screen may be controlled or operated, at least in part, by the processing system 110. The processing system 110 may be configured to execute instructions related to sensing inputs and displaying the interface. For example, the processing system 110 may drive a display electrode to display at least a portion of the interface and sense user inputs, concurrently. In another example, the processing system 110 may drive a first display electrode to display at least a portion of the interface while concurrently driving a second display electrode to sense user inputs.

Figure 2A:
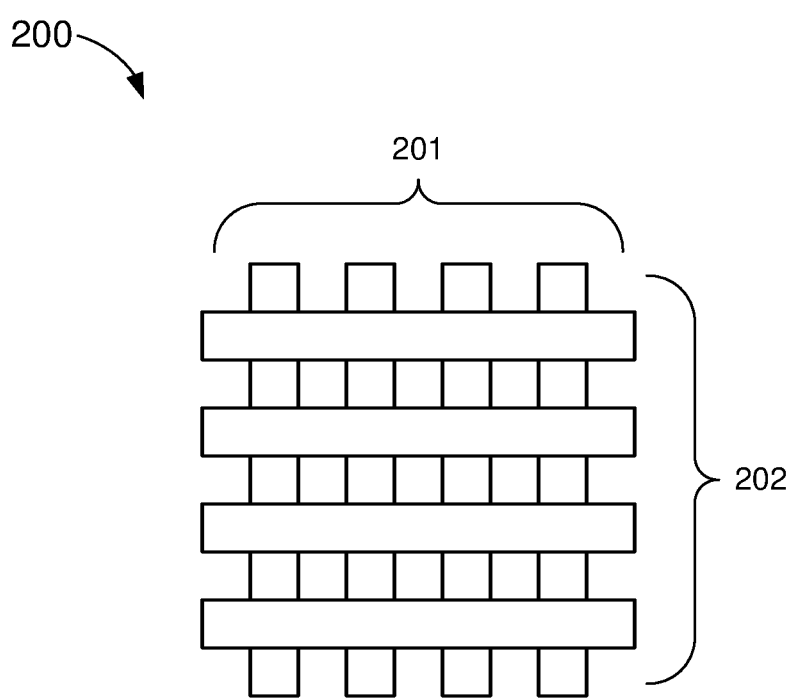
FIG. 2A shows an example array of sensor electrodes according to some implementations.

FIG. 2A shows an example array of sensor electrodes 200 according to some implementations. The array 200 is formed by a number of sensor electrodes 201 arranged in a vertical pattern and a number of sensor electrodes 202 arranged in a horizontal pattern. In some implementations, the array of sensor electrodes 200 may form at least a portion of the sensing region 120 of FIG. 1.

In some implementations, the sensor electrodes 201 and 202 may be arranged on different sides of the same substrate. For example, the sensor electrodes 201 and 202 may be disposed on one surface of the substrate. In some other implementations, the sensor electrodes 201 and 202 may be arranged on different substrates. For example, the sensor electrodes 201 and 202 may be disposed on surfaces of different substrates that are adhered together. Still further, in some implementations, the sensor electrodes 201 and 202 may be arranged on the same side or surface of a common substrate. For example, sensor electrodes 201 may include jumpers in region where the sensor electrodes 201 cross over sensor electrodes 202 (such that the jumpers are insulated from the sensor electrodes 202).

In the example of FIG. 2A, sensor electrodes 201 are shown to extend in a first (vertical) direction and sensor electrodes 202 are shown to extend in a second (horizontal) direction. Although the sensor electrodes 201 and 202 are depicted in a perpendicular grid arrangement, in some other implementations the sensor electrodes 201 and 202 may be arranged in other patterns. For example, in some implementations, the sensor electrodes 201 may be parallel or diagonal to the sensor electrodes 202. In the example of FIG. 2A, each of the sensor electrodes 201 and 202 is shown to have substantially the same shape and size. However, in some other implementations, the sensor electrodes 201 and 202 may be of various shapes and/or sizes.

A processing system (such as the processing system 110 of FIG. 1) may scan the array of sensor electrodes 201 and 202 to detect inputs in the sensing region. In some implementations, the sensor electrodes 201 and 202 may be configured to implement absolute capacitive sensing techniques. For example, the processing system may drive one or more of the sensor electrodes 201 and/or 202 with modulated signals (also referred to as "sensing signals") to determine changes in the absolute capacitance of the sensor electrodes. In some other implementations, the sensor electrodes 201 and 202 may be configured to implement transcapacitive sensing techniques. For example, the processing system may drive sensing signals on transmitter electrodes (such as sensor electrodes 202) and receive resulting signals on receiver electrodes (such as sensor electrodes 201).

A "capacitive pixel" may represent an area of localized capacitive coupling between sensor electrodes 201 and sensor electrodes 202. The capacitive coupling between sensor electrodes 201 and sensor electrodes 202 may change with a proximity and/or motion of input objects in the sensing region provided by the array of sensor electrodes 200. A capacitive pixel may also represent an area of localized capacitance between an input object and sensor electrodes 201 or sensor electrodes 202. Thus, the absolute capacitance of the sensor electrodes 201 and/or 202 may change with a proximity and/or motion of an input object in the sensing region.

Figure 2B:
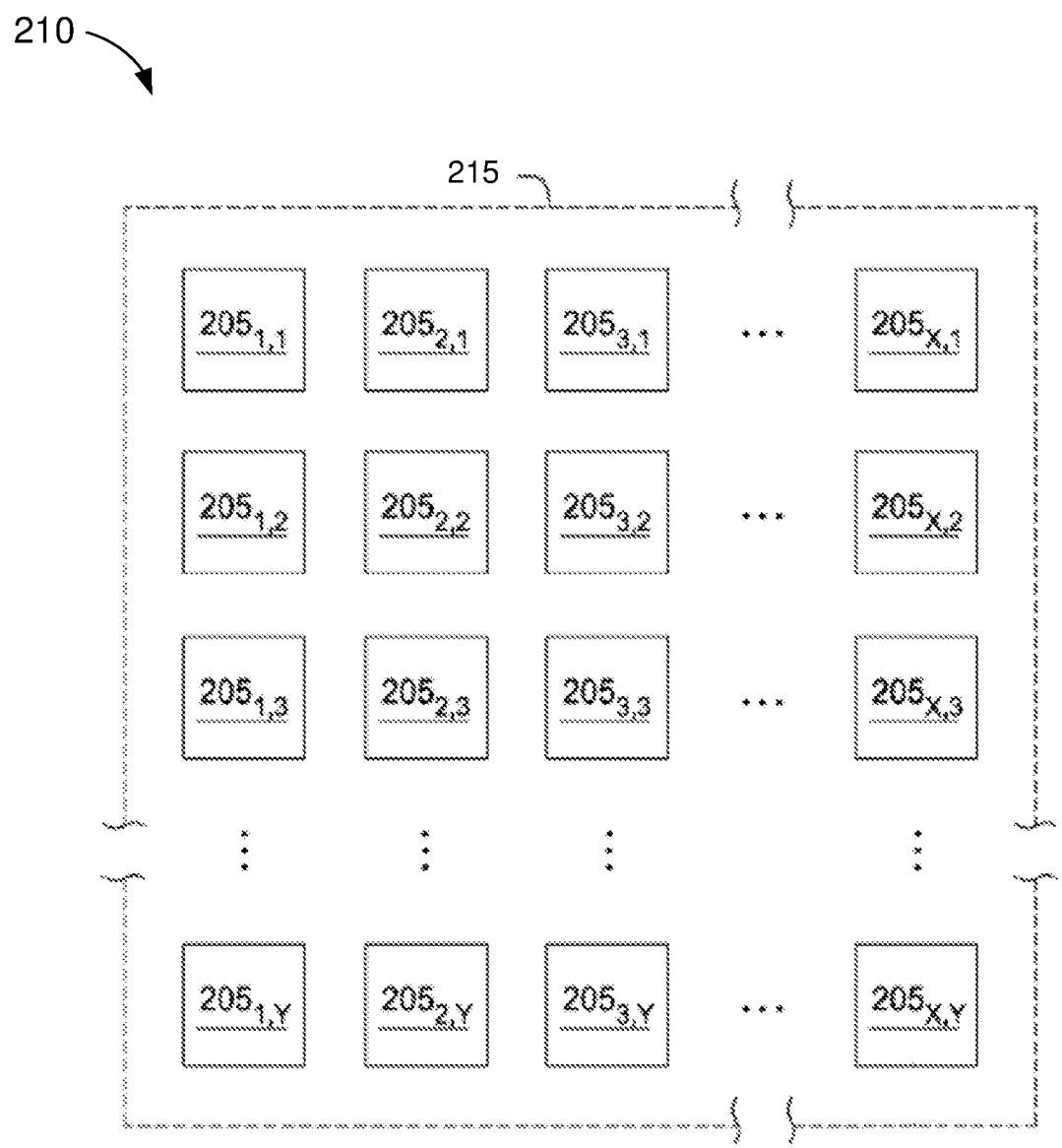
FIG. 2B shows another example array of sensor electrodes according to some implementations.

FIG. 2B shows another example array of sensor electrodes 210 according to some implementations. The array 210 is formed by a number of sensor electrodes 205$x,y$ (referred to collectively as sensor electrodes 205) arranged in an advanced matrix pad (AMP) configuration. The sensor electrodes 205 may provide a sensing region 215 that encompasses any space above, around, in, and/or proximate to the array 210. The size, shape, and/or location of the sensing region 215 may vary depending on actual implementations.

The sensor electrodes 205 are arranged in a number (X) of columns and a number (Y) of rows. In some implementations, the sensor electrodes 205 may be configured to implement absolute capacitance sensing techniques. For example, a processing system (such as the processing system 110 of FIG. 1) may drive each sensor electrode 205 with a modulated signal and measure a capacitance between the electrode 205 and the input object based on the modulated signal. In the example of FIG. 2B, capacitive pixels may be formed between an individual sensor electrode 205 and an electrical ground. The capacitive coupling may change with a proximity and/or motion of input objects in the sensing region 215 and may thus be used to determine the presence and/or position of an input object in the sensing region 215.

With reference to FIGS. 2A and 2B, a processing system may scan the array of sensor electrodes 200 or 210 over a number (N) of iterations to acquire a frame of capacitive sensor data (e.g., a "capacitive frame"). During each iteration of the scan, the processing system may drive the array of sensor electrodes 200 or 210 with a different pattern of sensing signals to acquire a respective subframe of sensor data. Upon completion of the scan, the processing system may combine the N subframes acquired from the N iterations, respectively, to produce a single capacitive frame. Each capacitive frame may represent an "image" or snapshot of the capacitive pixels in the array 200 or 210 at a given instance of time. Thus, the processing system may detect objects in or proximate to the sensing region based on changes in capacitance indicated in a capacitive frame (relative to a baseline).

In some implementations, the processing system may scan the array of sensor electrodes 200 or 210 in a raster order (such as from top-to-bottom or left-to-right). In other words, only one subset of rows (or columns) may be driven with a sensing signal per iteration of the scan. The processing system may drive a sensing signal onto a different subset of rows (or columns) of sensor electrodes during each successive iteration of the scan. For example, in a top-to-bottom raster scan, individual rows (or subsets of rows) of sensor electrodes may be driven in succession from the top of the array 200 or 210 to the bottom of the array. As a result, each row of sensor electrodes in the array 200 or 210 is scanned once after N iterations. Thus, each subframe of sensor data may represent a capacitive profile associated with a particular row or portion of the sensing region. The N subframes may be combined or aggregated to form a frame of sensor data representative of the sensing region in its entirety.

In some other implementations, the processing system may scan the array of sensor electrodes 200 or 210 using code division multiplexing (CDM) techniques. In a CDM sensing scheme, multiple sensing signals (of varying polarities) may be driven onto multiple rows (or columns) of sensor electrodes, concurrently, per iteration of the scan. For example, during each iteration of the scan, some rows of sensor electrodes may be driven with a positive polarity (+1) sensing signal, some rows of sensor electrodes may be driven with a negative polarity (−1) sensing signal, and some rows of sensor electrodes may not be driven (0) with a sensing signal. Thus, each subframe of sensor data may represent a capacitive profile associated with a different CDM "block." The N subframes may be decoded in accordance with a CDM matrix to recover a frame of sensor data representative of the sensing region.

The presence of input objects in the sensing region may cause changes in localized capacitance within a capacitive frame. As described above, a change in capacitance represents a deviation from the baseline capacitance of one or more sensor electrodes. Thus, accurate detection of input objects may depend on accurate filtering or suppression of the baseline capacitance. In some implementations, the processing system may subtract the baseline capacitance of each sensor electrode after acquiring a capacitive frame. In such implementations, the processing system may drive the sensor electrodes with sensing signals such that the baseline capacitance of each sensor electrode is reflected in each capacitive frame. In some other implementations, the baseline capacitance of each sensor electrode may be offset or canceled prior to (or during) the acquisition of a capacitive frame. In such implementations, a baseline correction circuit (such as a GCBC circuit) may drive the sensor electrodes with sensing signals such that only changes in the capacitances of the senor electrodes are reflected in each capacitive frame.

FIG. 3 shows a block diagram of an example input device 300 according to some implementations. In some implementations, the input device 300 may be one example of the input device 100 of FIG. 1. The input device 300 includes a number (N) of sensor electrodes 310(1)-310(N), a number (N) of integrator circuits 320(1)-320(N), sensing circuitry 330, and a global coarse baseline correction (GCBC) circuit 340.

The sensor electrodes 310(1)-310(N) may be examples of the sensor electrodes 201, 202, or 205 of FIGS. 2A and 2B. Each of the sensor electrodes 310(1)-310(N) may be associated with a respective channel of the input device 300. The sensor electrodes 310(1)-310(N) can be used to detect input objects in a sensing region of the input device 300 (not shown for simplicity). In some implementations, the sensing circuitry 330 may detect a presence and/or position of one or more input objects by measuring respective capacitances of the sensor electrodes 310(1)-310(N). The capacitances can be measured by driving the sensor electrodes 310(1)-310(N) with sensing signals (also referred to as "sensing currents") $I_{S1}$-$I_{SN}$, respectively. Each of the integrator circuits 320(1)-320(N) may be configured to integrate a charge associated with a respective one of the sensing currents $I_{S1}$-$I_{SN}$. As such, each of the integrator circuits 320(1)-320(N) also may be associated with a respective channel of the input device 300.

As shown in FIG. 3, each of the integrator circuits 320(1)-320(N) includes an op-amp (322(1)-322(N), respectively) and a feedback capacitor ($C_{FB1}$-$C_{FBN}$, respectively). Each of the op-amps 322(1)-322(N) has an inverting (−) input coupled to a respective one of the sensor electrodes 310(1)-310(N) and a non-inverting input (+) coupled to the sensing circuitry 330. Each of the feedback capacitors $C_{FB1}$-$C_{FBN}$ is coupled between an output and the inverting input of a respective one of the op-amps 322(1)-322(N), in a negative feedback configuration. As such, the sensing currents $I_{S1}$-$I_{SN}$ may charge the feedback capacitors $C_{FB1}$-$C_{FBN}$ to produce output voltages $V_{out1}$-$V_{outN}$ at the outputs of the op-amps 322(1)-322(N), respectively. Because the sensing currents $I_{S1}$-$I_{SN}$ are affected by the capacitances of the sensor electrodes 310(1)-310(N), the sensing circuitry 330 may detect changes in the capacitances of the sensor electrodes 310(1)-310(N) based on the output voltages $V_{out1}$-$V_{outN}$, respectively.

In some implementations, the sensing currents $I_{S1}$-$I_{SN}$ may be driven by the sensing circuitry 330. For example, the sensing circuitry 330 may produce a reference voltage $V_{ref}$ at the non-inverting inputs of each of the op-amps 322(1)-322(N). In such implementations, the output voltages $V_{out1}$-$V_{outN}$ may initially track the reference voltage $V_{ref}$ (such as when no charge is stored across the feedback capacitors $C_{FB1}$-$C_{FBN}$ or the sensor electrodes 310(1)-310(N), which causes sensing currents $I_{S1}$-$I_{SN}$ to flow to the sensor electrodes 310(1)-310(N), respectively. However, because the output voltages $V_{out1}$-$V_{outN}$ may vary as charge accumulates on the sensor electrodes 310(1)-310(N) (regardless of whether input objects are present in the sensing region), the capacitances measured by the sensing circuitry 330 may include the baseline capacitances of the sensor electrodes 310(1)-310(N) (as well as the capacitances of any input objects in the sensing region).

In some other implementations, the sensing currents $I_{S1}$-$I_{SN}$ may be provided by the GCBC circuit 340. More specifically, the GCBC circuit 340 may generate the sensing currents $I_{S1}$-$I_{SN}$ based on the capacitances of the sensor electrodes 310(1)-310(N) so that, when no input objects are capacitively coupled thereto, there is no net current flowing to the feedback capacitors $C_{FB1}$-$C_{FBN}$. In such implementations, the output voltages $V_{out1}$-$V_{outN}$ may not reflect the baseline capacitances of the sensor electrodes 310(1)-310(N). For example, because there is no net current flowing to the feedback capacitors $C_{FB1}$-$C_{FBN}$, the output voltages $V_{out1}$-$V_{outN}$ remain substantially constant (~VDD/2) when there are no input objects present in the sensing region. The presence of an input object in the sensing region may cause the output voltages $V_{out1}$-$V_{outN}$ to vary (relative to the constant voltage level) based on changes in the capacitive couplings of the sensor electrodes 310(1)-310(N). In this manner, the baseline capacitances of the sensor electrodes 310(1)-310(N) are effectively removed or filtered from the capacitances measured by the sensing circuitry 330.

Some GCBC circuits may operate by generating a common sensing signal and copying the sensing signal onto each of the channels of the input device 300. For example, current mirrors may be used to copy or reproduce the common sensing signal in each channel. Aspects of the present disclosure recognize that the transistors used in current mirrors are susceptible to flicker noise, which limits the achievable noise floor. Further, aspects of the present disclosure recognize that current mirrors are sensitive to mismatches and exhibit drift in response to temperature changes. In other words, changes in the temperature of the GCBC circuit may cause variations in the sensing signals produced by one or more current mirrors, which may affect the accuracy of capacitive sensing.

In some implementations, the GCBC circuit 340 may include a current source configured to output a current ($I_{GCBC}$), a transimpedance amplifier (TIA) configured to convert the current $I_{GCBC}$ to a sensing voltage ($V_S$), and a number (N) of signal-producing (SP) resistors that can be coupled between the output of the TIA and the sensor electrodes 310(1)-310(N), respectively. The coupling of the SP resistors between the TIA and the sensor electrodes 310(1)-310(N) produces the sensing currents $I_{S1}$-$I_{SN}$. Unlike current mirrors, resistors are not susceptible to flicker noise. In some implementations, each of the SP resistors may have the same temperature coefficient of resistance (TCR) as a feedback resistor used in the TIA to produce the sensing voltage $V_S$. As a result, temperature drift in each in each of the SP resistors is offset (or canceled out) by the temperature drift in the feedback resistor of the TIA. Accordingly, aspects of the present disclosure may reduce or eliminate various types of noise or interference (such as temperature drift and flicker noise) that would otherwise affect sensing signals produced by a GCBC circuit.

Figure 4A:
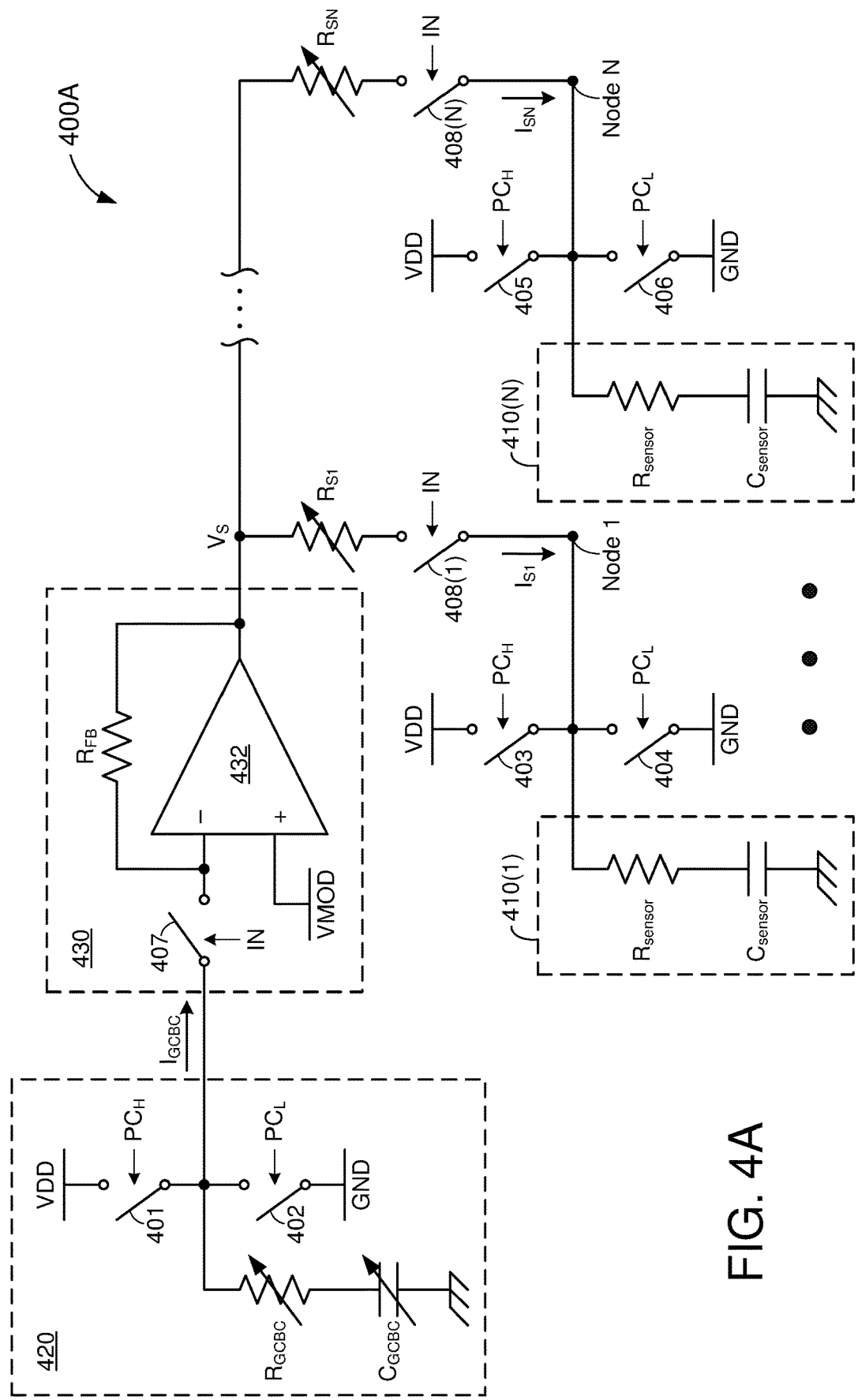
FIGS. 4A and 4B show circuit diagrams of an example input device according to some implementations.
Figure 4B:
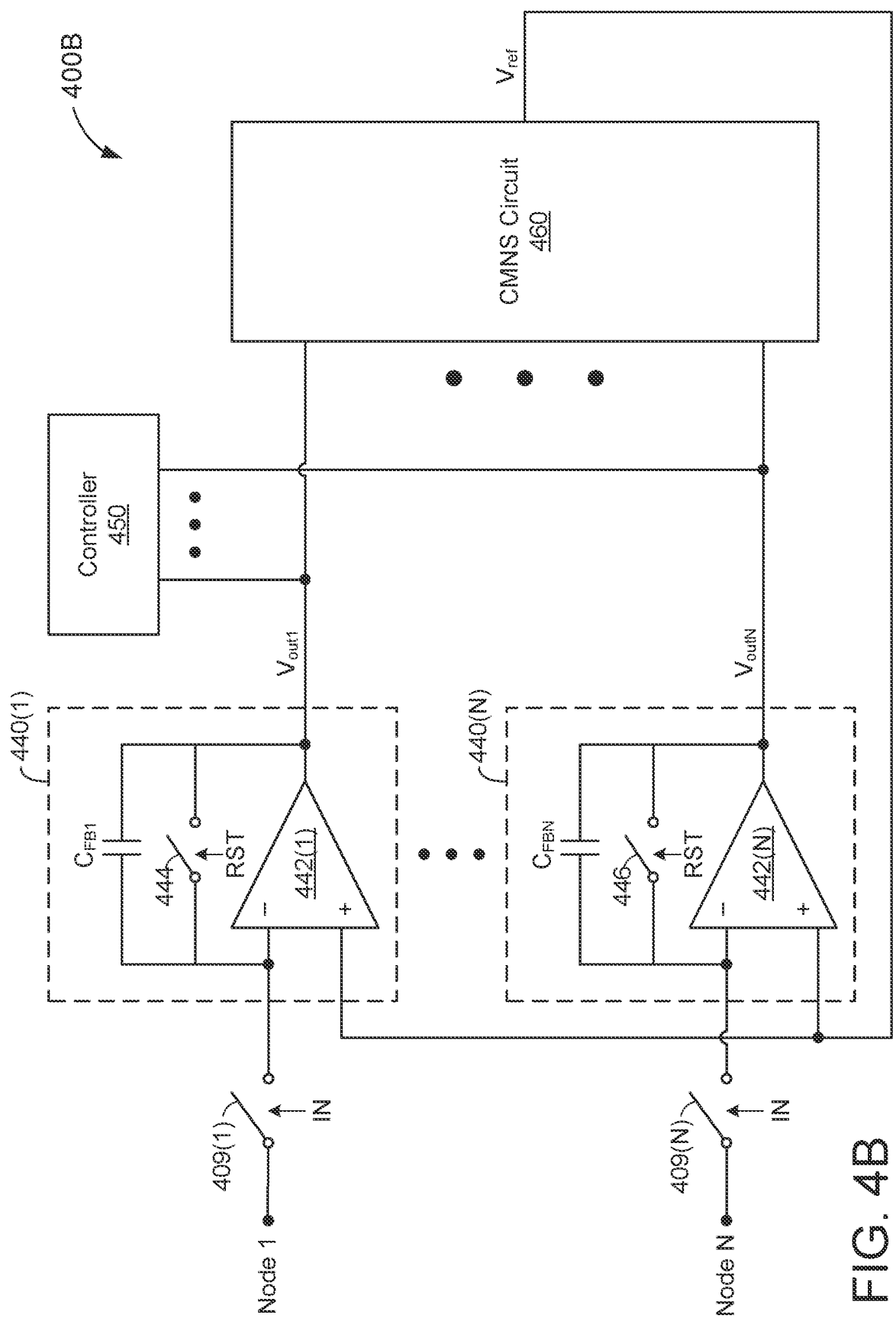

FIGS. 4A and 4B show circuit diagrams of an example input device according to some implementations. More specifically, FIG. 4A shows a first portion 400A of the input device and FIG. 4B shows a second portion 400B of the input device. In some implementations, the input device may be one example of the input device 300 of FIG. 3.

The first portion 400A of the input device includes a number (N) of sensor electrodes 410(1)-410(N), a current source 420, a transimpedance amplifier (TIA) 430, and a number (N) of SP resistors $R_{S1}$-$R_{SN}$. With reference for example to FIG. 3, the current source 420, TIA 430, and resistors $R_{S1}$-$R_{SN}$ may be one example of the GCBC circuit 340. The sensor electrodes 410(1)-410(N) may be examples of the sensor electrodes 310(1)-310(N), respectively, of FIG. 3. As shown in FIG. 4A, each of the sensor electrodes 410(1)-410(N) has a capacitance ($C_{sensor}$) and a resistance ($R_{sensor}$). In some implementations, each of the sensor electrodes 410(1)-410(N) may be switchably coupled to a voltage source such as, for example, a voltage rail (VDD) or ground (GND). For example, switches 403 and 405 may couple the sensor electrodes 410(1) and 410(N), respectively, to VDD in response to a precharge-high ($PC_H$) signal. Similarly, switches 404 and 406 may couple the sensor electrodes 410(1) and 410(N), respectively, to GND in response to a preharge-low ($PC_L$) signal.

The current source 420 includes a capacitor $C_{GCBC}$ coupled in series with a resistor $R_{GCBC}$. In some implementations, $C_{GCBC}$ and $R_{GCBC}$ may be tuned to match $C_{sensor}$ and $R_{sensor}$, respectively. In some implementations, the capacitor $C_{GCBC}$ and the resistor $R_{GCBC}$ may be switchably coupled to a voltage source such as, for example, VDD or GND. For example, a switch 401 may couple the capacitor $C_{GCBC}$ and the resistor $R_{GCBC}$ to VDD in response to the $PC_H$ signal. Similarly, a switch 402 may couple the capacitor $C_{GCBC}$ and the resistor $R_{GCBC}$ to GND in response to the $PC_L$ signal. The TIA 430 includes an op-amp 432 and a feedback resistor $R_{FB}$. The op-amp 432 has a non-inverting (+) input coupled to a voltage source (VMOD) and an inverting (−) input switchably coupled to the current source 420. For example, a switch 407 may couple the inverting input of the op-amp 432 to $R_{GCBC}$ in response to an input sensing (IN) signal. The feedback resistor $R_{FB}$ is coupled between an output of the op-amp 432 and the inverting input, in a negative feedback configuration.

The SP resistors $R_{S1}$-$R_{SN}$ are switchably coupled between the output of the TIA 430 (corresponding to the output of the op-amp 432) and the sensor electrodes 410(1)-410(N), respectively. In the example of FIG. 4A, each of the SP resistors $R_{S1}$-$R_{SN}$ has a first terminal coupled to the output of the TIA 430 and a second terminal that can be coupled to a respective one of the sensor electrodes 410(1)-410(N) via a switch. For example, switches 408(1)-408(N) may couple the SP resistors $R_{S1}$-$R_{SN}$ to the sensor electrodes 410(1)-410(N), respectively, in response to the IN signal. In some implementations, each of the SP resistors $R_{S1}$-$R_{SN}$ may have the same temperature coefficient of resistance (TCR) as the feedback resistor $R_{FB}$. For example, the resistors $R_{FB}$ and $R_{S1}$-$R_{SN}$ may be manufactured using the same process and/or materials. In some implementations, the resistance values of the SP resistors $R_{S1}$-$R_{SN}$ may be individually tuned, for example, to compensate for variations in the properties of one or more sensor electrodes 410(1)-410(N) (such as $R_{sensor}$ or $C_{sensor}$).

The second portion 400B of the input device includes a number (N) of integrator circuits 430(1)-440(N), a controller 450, and a common-mode noise suppression (CMNS) circuit 460. With reference for example to FIG. 3, the controller 450 and CMNS circuit 460 may be one example of the detection circuitry 330. The integrator circuits 440(1)-440(N) may be examples of the integrator circuits 320(1)-320(N), respectively, of FIG. 3. In the example of FIG. 4B, each of the integrator circuits 440(1)-440(N) includes an op-amp (442(1)-442(N), respectively) and a feedback capacitor ($C_{FB1}$-$C_{FBN}$, respectively). Each of the op-amps 442(1)-442(N) has an inverting (−) input switchably coupled to a respective one of the sensor electrodes 410(1)-410(N) and a non-inverting input (+) coupled to an output of the CMNS circuit 460. For example, switches 409(1)-409(N) may couple the inverting inputs of op-amps 442(1)-442(N) to sensor electrodes 410(1)-410(N) (via nodes 1-N), respectively, in response to the IN signal. Each of the feedback capacitors $C_{FB1}$-$C_{FBN}$ is coupled, in parallel with a respective switch, between an output and the inverting input of a respective one of the op-amps 442(1)-442(N), in a negative feedback configuration. For example, switches 444 and 446 may short the output and inverting input terminals of op-amps 442(1) and 442(N), respectively, in response to a reset (RST) signal.

The controller 450 is coupled to the outputs of the integrator circuits 442(1)-442(N) (corresponding to the outputs of op-amps 442(1)-442(N), respectively) and is configured to detect changes in the capacitances of one or more sensor electrodes 410(1)-410(N) based on the output voltages $V_{out1}$-$V_{outN}$, respectively, of the integrator circuits 442(1)-442(N). In some implementations, the controller 450 may be one example of the processing system 110 of FIG. 1. For example, the controller 450 may capture or acquire capacitive frames based on the output voltages $V_{out1}$-$V_{outN}$. In some aspects, the controller 450 may further control an operation of the input device (such as by asserting and deasserting one or more of the signals $PC_H$, $PC_L$, IN, or RST). The CMNS circuit 460 is also coupled to the outputs of the integrator circuits 442(1)-442(N). In some implementations, the CMNS circuit 460 may be configured to reduce or mitigate common-mode noise in the GCBC circuit (such as in the current source 420 or the TIA 430). As described in greater detail with reference to FIG. 6, the CMNS circuit 460 may produce a reference voltage ($V_{ref}$) based on a combination (such as a sum or average) of the output voltages $V_{out1}$-$V_{outN}$ and provide the reference voltage $V_{ref}$ to the non-inverting inputs of each of the op-amps 442(1)-442(N).

Figure 5:
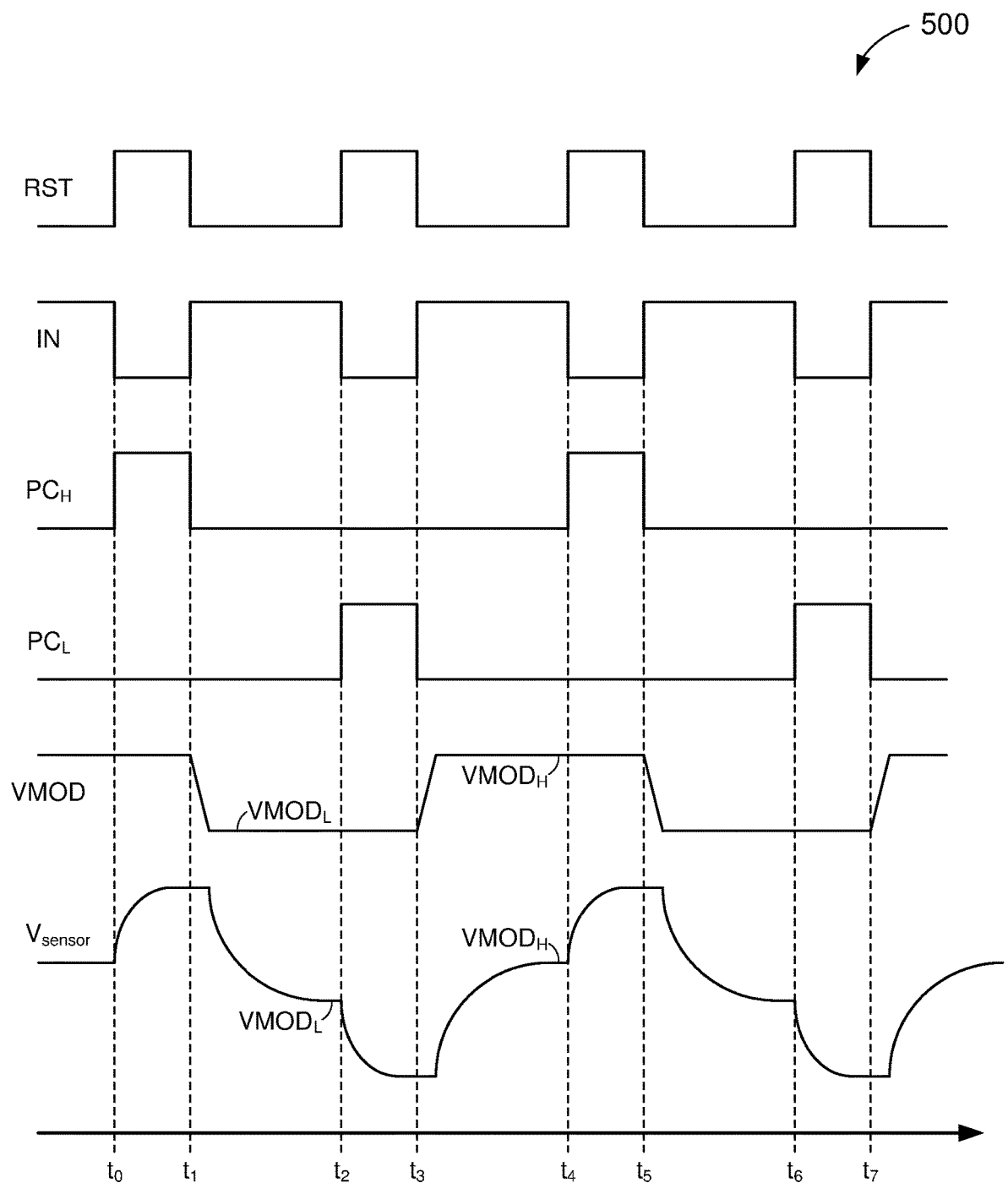
FIG. 5 shows a timing diagram depicting an example capacitive scanning operation according to some implementations.

FIG. 5 shows a timing diagram 500 depicting an example capacitive scanning operation according to some implementations. The capacitive scanning operation may be performed by an input device such as, for example, the input device of FIGS. 4A and 4B. In some implementations, the capacitive scanning operation may be controlled by the controller 450 of FIG. 4B.

At time t0, the controller 450 operates the input device in a first "precharge" mode by asserting the RST and $PC_H$ signals and deasserting the IN signal. Switches 407, 408(1)-408(N), and 409(1)-409(N) are opened based on the deassertion of the IN signal. Switching circuitry in each of the integrator circuits 442(1)-442(N) (such as switches 444 and 446) is closed based on the assertion of the RST signal, causing the feedback capacitors $C_{FB1}$-$C_{FBN}$ to discharge (or charge) to an initial state. Switching circuitry in the current source (such as switch 401) couples the capacitor $C_{GCBC}$ and resistor $R_{GCBC}$ to VDD based on the assertion of the $PC_H$ signal, causing the capacitor $C_{GCBC}$ to charge up to a high pre-charge voltage level (such as VDD). Switching circuitry associated with the sensor electrodes (such as switches 403 and 405) couple the sensor electrodes 410(1)-410(N) to VDD based on the assertion of the $PC_H$ signal, causing the sensor electrodes 410(1)-410(N) to charge up to a high pre-charge voltage level (such as VDD). For example, as shown in FIG. 5, a voltage ($V_{sensor}$) associated with $C_{sensor}$ rises to ~VDD over the duration that the $PC_H$ signal is asserted (such as from times $t_0$ to $t_1$).

At time $t_1$, the controller 450 operates the input device in an "input sensing" mode by deasserting the RST and $PC_H$ signals and asserting the IN signal. Switching circuitry in each of the integrator circuits 442(1)-442(N) (such as switches 444 and 446) is opened based on the deassertion of the RST signal; switching circuitry in the current source (such as switch 401) decouples the capacitor $C_{GCBC}$ and resistor $R_{GCBC}$ from VDD based on the deassertion of the $PC_H$ signal; and switching circuitry associated with the sensor electrodes (such as switches 403 and 405) decouple the sensor electrodes 410(1)-410(N) from VDD based on the deassertion of the $PC_H$ signal. Switch 407 is closed based on the assertion of the IN signal, coupling a first input of the TIA 430 (corresponding to the inverting input of op-amp 432) to the current source 420. Switches 409(1)-409(N) are closed based on the assertion of the IN signal, coupling first inputs of the integrator circuits 440(1)-440(N) (corresponding to the inverting inputs of op-amps 442(1)-442(N)) to the sensor electrodes 410(1)-410(N), respectively. Switches 408(1)-408(N) are closed based on the assertion of the IN signal, coupling the SP resistors $R_{S1}$-$R_{SN}$ to the sensor electrodes 410(1)-410(N), respectively.

While operating in the input sensing mode, from times $t_1$ to $t_2$, the current source 420 produces a current $I_{GCBC}$ by discharging the capacitor $C_{GCBC}$. The TIA 430 converts the current $I_{GCBC}$ to a sensing voltage $V_S$ at its output. The sensing voltage $V_S$ can be expressed as a function of the voltage (VMOD) at the non-inverting input of the op-amp 432 and the resistance ($R_{FB}$) of the feedback resistor. For example, the sensing voltage $V_S$ can be determined according to Equation 1:

$$V_S = VMOD - I_{GCBC} R_{FB} \quad (1)$$

Each of the SP resistors $R_{S1}$-$R_{SN}$ produces a sensing current ($I_{S1}$-$I_{SN}$) based on a voltage differential between $V_S$ and the voltages at nodes 1-N, respectively. The sensing current ($I_S$) in a given channel may be proportional to $I_{GCBC}$ based on the resistance ($R_{FB}$) of the feedback resistor and the resistance ($R_S$) of the SP resistor coupled to that channel. For example, the sensing current $I_S$ can be determined according to Equation 2:

$$I_S = I_{GCBC} \frac{R_{FB}}{R_S} \quad (2)$$

As shown in Equation 2, the values of the sensing currents $I_{S1}$-$I_{SN}$ are dependent upon the ratio of the resistances of $R_{FB}$ to $R_{S1}$-$R_{SN}$. Because the resistors $R_{FB}$ and $R_{S1}$-$R_{SN}$ have the same TCR, any temperature drift in $R_{FB}$ is offset (or canceled out) by a corresponding amount of temperature drift in each of $R_{S1}$-$R_{SN}$. As a result, the sensing currents $I_{S1}$-$I_{SN}$ may be insensitive to (or unaffected by) temperature changes in the GCBC circuit and do not exhibit temperature drift. Further, the sensing currents $I_{S1}$-$I_{SN}$ are produced by the TIA 430 and SP resistors $R_{S1}$-$R_{SN}$ (in lieu of current mirrors), the sensing currents $I_{S1}$-$I_{SN}$ also may be free of flicker noise. Accordingly, the sensing currents $I_{S1}$-$I_{SN}$ can more accurately correct for the baseline capacitances of the sensor electrodes 410(1)-410(N).

In some implementations, the sensing currents $I_{S1}$-$I_{SN}$ may discharge the sensor electrodes 410(1)-410(N). For example, as shown in FIG. 5, the voltage VMOD at the non-inverting input of op-amp 432 is driven to a low voltage potential ($VMOD_L$) at time $t_1$. As a result, the voltage $V_{sensor}$ associated with $C_{sensor}$ falls to $VMOD_L$ over the duration that the IN signal is asserted (such as from times $t_1$ to $t_2$). Each of the integrator circuits 440(1)-440(N) compares the voltage of a respective one of the sensor electrodes 410(1)-410(N) with the reference voltage $V_{ref}$ and outputs the difference as a respective output voltage ($V_{out1}$-$V_{outN}$). As described with reference to FIG. 4B, the reference voltage $V_{ref}$ is generated by the CMNS circuit 460, based on the output voltages $V_{out1}$-$V_{outN}$, and may account for common-mode noise in the GCBC circuit. This ensures that any changes in the output voltages $V_{out1}$-$V_{outN}$ can be more accurately attributed to changes in the capacitances of the sensor electrodes 410(1)-410(N) (rather than any sources of noise or interference in the GCBC circuit). The controller 450 may acquire a first capacitive frame based on the charges stored on the feedback capacitors $C_{FB1}$-$C_{FBN}$ (represented by the output voltages $V_{out1}$-$V_{outN}$, respectively) at the end of the input sensing operation (such as at time $t_2$).

At time $t_2$, the controller 450 operates the input device in a second precharge mode by asserting the RST and $PC_L$ signals and deasserting the IN signal. Switches 407, 408(1)-408(N), and 409(1)-409(N) are opened based on the deassertion of the IN signal. Switching circuitry in each of the integrator circuits 442(1)-442(N) (such as switches 444 and 446) is closed based on the assertion of the RST signal, causing the feedback capacitors $C_{FB1}$-$C_{FBN}$ to discharge (or charge) to an initial state. Switching circuitry in the current source (such as switch 402) couples the capacitor $C_{GCBC}$ and resistor $R_{GCBC}$ to GND based on the assertion of the $PC_L$ signal, causing the capacitor $C_{GCBC}$ to discharge to a low pre-charge voltage level (such as GND). Switching circuitry associated with the sensor electrodes (such as switches 404 and 406) couple the sensor electrodes 410(1)-410(N) to GND based on the assertion of the $PC_L$ signal, causing the sensor electrodes 410(1)-410(N) to discharge to a low pre-charge voltage level (such as VDD). For example, as shown in FIG. 5, the voltage $V_{sensor}$ associated with $C_{sensor}$ drops to ~0 over the duration that the $PC_L$ signal is asserted (such as from times $t_2$ to $t_3$).

At time $t_3$, the controller 450 once again operates the input device in the input sensing mode by deasserting the RST and $PC_L$ signals and asserting the IN signal. Switching circuitry in each of the integrator circuits 442(1)-442(N) (such as switches 444 and 446) is opened based on the deassertion of the RST signal; switching circuitry in the current source (such as switch 402) decouples the capacitor $C_{GCBC}$ and resistor $R_{GCBC}$ from GND based on the deassertion of the $PC_L$ signal; and switching circuitry associated with the sensor electrodes (such as switches 404 and 406) decouple the sensor electrodes 410(1)-410(N) from GND based on the deassertion of the $PC_L$ signal. Switch 407 is closed based on the assertion of the IN signal, coupling the first input of the TIA 430 (corresponding to the inverting input of op-amp 432) to the current source 420. Switches 409(1)-409(N) are closed based on the assertion of the IN signal, coupling the first inputs of the integrator circuits 440(1)-440(N) (corresponding to the inverting inputs of op-amps 442(1)-442(N)) to the sensor electrodes 410(1)-410(N), respectively. Switches 408(1)-408(N) are closed based on the assertion of the IN signal, coupling the SP resistors $R_{S1}$-$R_{SN}$ to the sensor electrodes 410(1)-410(N), respectively.

While operating in the input sensing mode, from times $t_3$ to $t_4$, the current source 420 produces a current $I_{GCBC}$ by charging the capacitor $C_{GCBC}$. The TIA 430 converts the current $I_{GCBC}$ to a sensing voltage $V_S$ at its output. The sensing voltage $V_S$ can be expressed as a function of the voltage (VMOD) at the non-inverting input of the op-amp 432 and the resistance ($R_{FB}$) of the feedback resistor (as shown in Equation 1). Each of the SP resistors $R_{S1}$-$R_{SN}$ produces a sensing current ($I_{S1}$-$I_{SN}$) based on a voltage differential between $V_S$ and the voltages at nodes 1-N, respectively. The sensing current ($I_S$) in a given channel may be proportional to $I_{GCBC}$ based on the resistance ($R_{FB}$) of the feedback resistor and the resistance ($R_S$) of the SP resistor coupled to that channel (as shown in Equation 2).

In some implementations, the sensing currents $I_{S1}$-$I_{SN}$ may charge the sensor electrodes 410(1)-410(N). For example, as shown in FIG. 5, the voltage VMOD at the non-inverting input of op-amp 432 is driven to a high voltage potential ($VMOD_H$) at time $t_3$. As a result, the voltage $V_{sensor}$ associated with $C_{sensor}$ rises to $VMOD_H$ over the duration that the IN signal is asserted (such as from times $t_3$ to $t_4$). Each of the integrator circuits 440(1)-440(N) compares the voltage of a respective one of the sensor electrodes 410(1)-410(N) with the reference voltage $V_{ref}$ and outputs the difference as a respective output voltage ($V_{out1}$-$V_{outN}$). The controller 450 may acquire a second capacitive frame based on the charges stored on the feedback capacitors $C_{FB1}$-$C_{FBN}$ (represented by the output voltages $V_{out1}$-$V_{outN}$, respectively) at the end of the input sensing operation (such as at time $t_4$).

At time $t_4$, the controller 450 again operates the input device in the first precharge mode by asserting the RST and $PC_H$ signals and deasserting the IN signal. While operating in the first precharge mode, from times $t_0$ to $t_5$, the input device may repeat the operations performed during times $t_0$ to $t_1$, for example, to precharge the current source 420 and each of the sensor electrodes 410(1)-410(N) to VDD. At time $t_5$, the controller 450 again operates the input device in the input sensing mode by deasserting the RST and $PC_H$ signals and asserting the IN signal. While operating in the input sensing mode, from times $t_5$ to $t_6$, the input device may repeat the operations performed during times $t_2$ to $t_3$, for example, to acquire a third capacitive frame.

At time $t_6$, the controller 450 again operates the input device in the second precharge mode by asserting the RST and $PC_L$ signals and deasserting the IN signal. While operating in the second precharge mode, from times $t_0$ to $t_7$, the input device may repeat the operations performed during times $t_2$ to $t_3$, for example, to precharge the current source 420 and each of the sensor electrodes 410(1)-410(N) to GND. At time $t_7$, the controller 450 again operates the input device in the input sensing mode by deasserting the RST and $PC_L$ signals and asserting the IN signal. While operating in the input sensing mode, at time $t_7$, the input device may repeat the operations performed during times $t_3$ to $t_4$, for example, to acquire a fourth capacitive frame.

Figure 6:
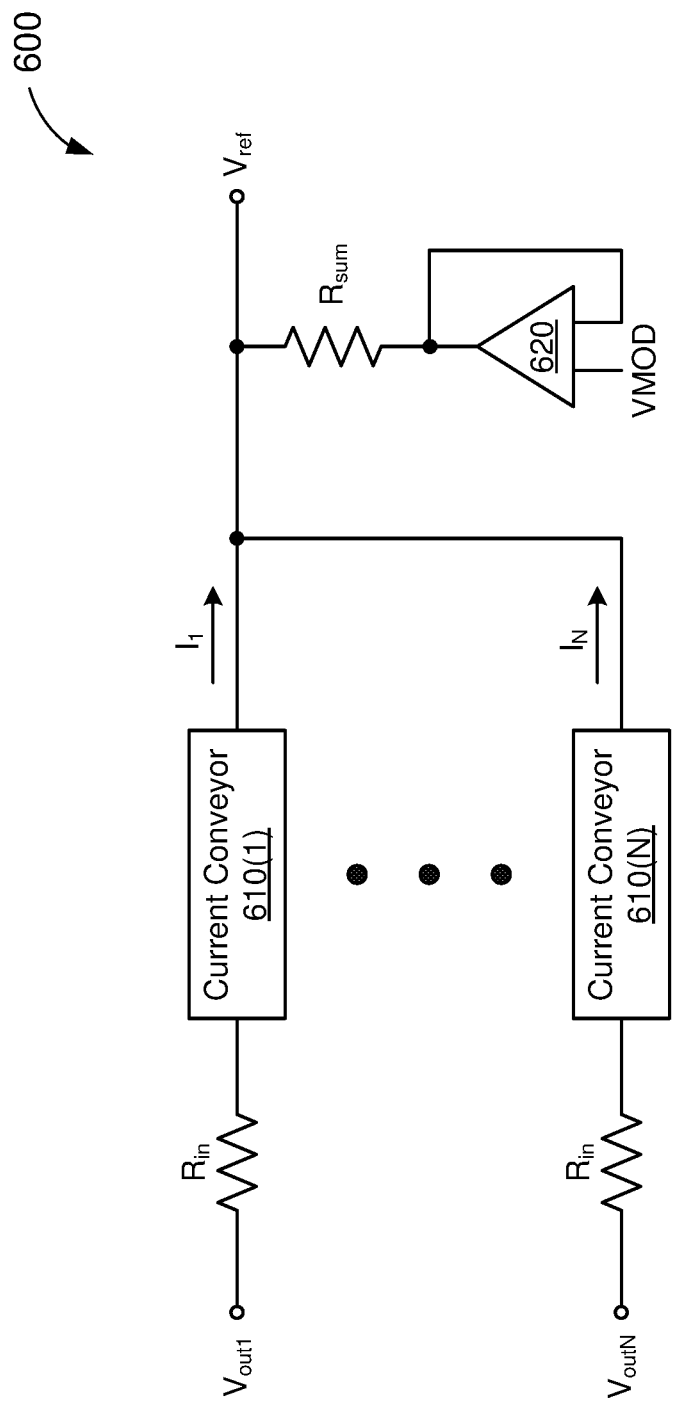
FIG. 6 shows a circuit diagram of an example common-mode noise suppression (CMNS) circuit according to some implementations.

FIG. 6 shows a circuit diagram of an example CMNS circuit 600 according to some implementations. In some implementations, the CMNS circuit 600 may be one example of the CMNS circuit 460 of FIG. 4B. The CMNS circuit 600 includes a number (N) of input resistors $R_{in}$, a number (N) of current conveyors 610(1)-610(N), a summing resistor $R_{sum}$, and a buffer 620. Each of the N input resistors $R_{in}$ is coupled to the output of a respective integrator circuit (such as the integrator circuits 440(1)-440(N) of FIG. 4B). The current conveyors 610(1)-610(N) produce currents $I_1$-$I_N$ based on the output voltages $V_{out1}$-$V_{outN}$, respectively, at the outputs of the integrator circuits. The buffer 620 stores a voltage value VMOD and the summing resistor $R_{sum}$ produces a reference voltage $V_{ref}$ based on a sum of the currents $I_1$-$I_N$ and VMOD. In some implementations, the summing resistor $R_{sum}$ may have a resistance equal to $$A \frac{R_{in}}{N},$$

where A represents a gain of the CMNS circuit 600.

As described above with reference to FIG. 4B, the reference voltage $V_{ref}$ may be provided to the non-inverting inputs of op-amps 442(1)-442(N), for example, to mitigate common-mode noise ($V_n$) produced by the GCBC circuit and/or other sources of common-mode noise or interference. For example, the coupling of noise to the sensor electrodes 410(1)-410(N) can be modeled as an impedance ($Z_B$). By using the output of the CMNS circuit 600 as the reference voltage $V_{ref}$, the noise gain ($V_{out}/V_N$) in a given channel of the input device can be determined as:

$$\frac{V_{out}}{V_N} = -\frac{Z_{FB}}{Z_B} \left( \frac{1}{1 + A + A \frac{Z_{FB}}{Z_B}} \right)$$

where $Z_{FB}$ is the impedance of the negative feedback path of a respective integrator circuit ($Z_{FB}=1/C_{FB}$). When the gain of the CMNS circuit 600 is sufficiently high (A>>1), the noise gain can be approximated as:

$$\frac{V_{out}}{V_N} = -\frac{Z_{FB}}{Z_B} * \frac{1}{A} \left( \frac{1}{1 + \frac{Z_{FB}}{Z_B}} \right)$$

As a result, any common-mode noise $V_N$ in the input device may be attenuated by:

$$\frac{1}{A} \left( \frac{1}{1 + \frac{Z_{FB}}{Z_B}} \right)$$

In some implementations, the feedback impedance $Z_{FB}$ may be substantially greater than the impedance $Z_B$ modeled after the common-mode noise ($Z_{FB}>>Z_B$). Thus, the amount of attenuation can be approximated as:

$$\frac{Z_B}{A * Z_{FB}}$$

Figure 7:
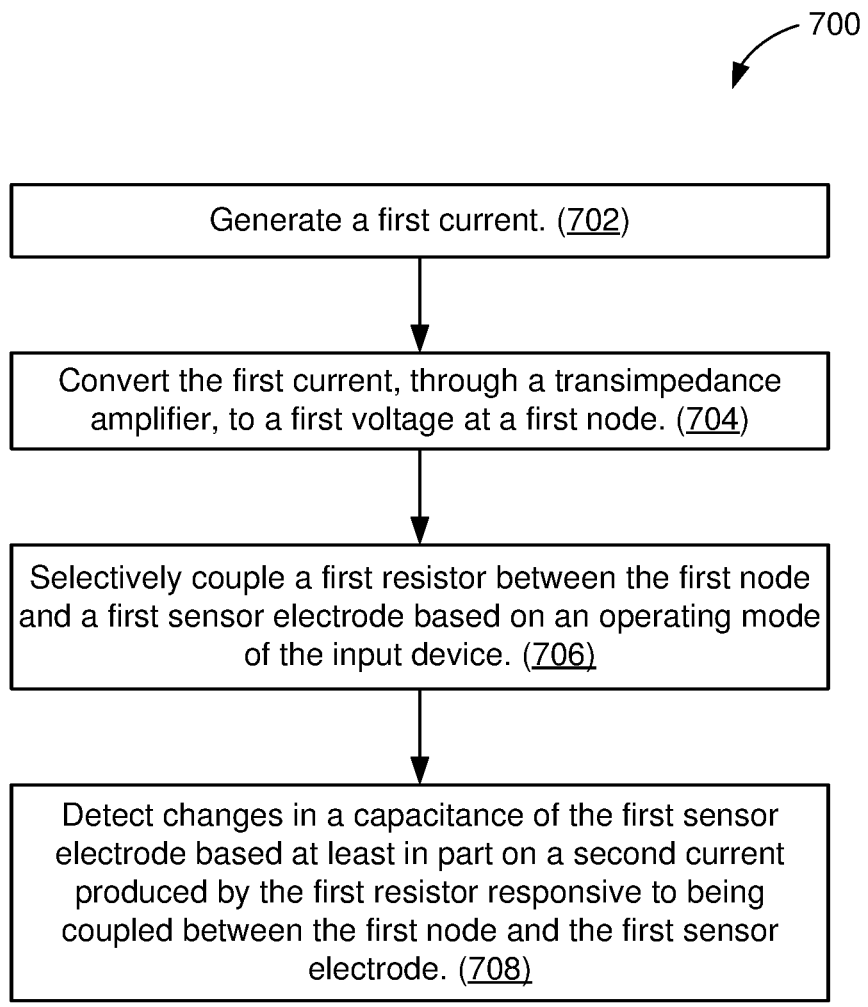
FIG. 7 shows an illustrative flowchart depicting an example capacitive scanning operation according to some implementations.

FIG. 7 shows an illustrative flowchart depicting an example capacitive scanning operation 700 according to some implementations. With reference for example to FIGS. 4A and 4B, the operation 700 may be performed by the input device (including portions 400A and 400B) to acquire one or more frames of capacitive sensor data.

The input device generates a first current (702). For example, when operating in a precharge mode, the input device may precharge the capacitor $C_{GCBC}$ to an initial voltage level (such as VDD or GND) by deasserting the IN signal, asserting the RST signal, and asserting one of the $PC_H$ or $PC_L$ signals. When operating in a subsequent input sensing mode, the input device may discharge (or charge) the capacitor $C_{GCBC}$ by deasserting the RST and $PC_H/PC_L$ signals and asserting the IN signal. As described with reference to FIG. 4A, the discharging (or charging) of the capacitor $C_{GCBC}$ produces a current $I_{GCBC}$ across the resistor $R_{GCBC}$.

The input device converts the first current, through a transimpedance amplifier, to a first voltage at a first node (704). With reference for example to FIG. 4A, switch 407 is closed based on the assertion of the IN signal, coupling a first input of the TIA 430 (corresponding to the inverting input of op-amp 432) to the current source 420. As a result of the coupling, the TIA 430 converts the current $I_{GCBC}$ to a sensing voltage VS at its output. The sensing voltage $V_S$ can be expressed as a function of the voltage (VMOD) at the non-inverting input of the op-amp 432 and the resistance ($R_{FB}$) of the feedback resistor (as shown in Equation 1).

The input device selectively couples a first resistor between the first node and a first sensor electrode based on an operating mode of the input device (706). As described above, the input device asserts the IN signal when operating in the input sensing mode. With reference for example to FIG. 4A, switches 408(1)-408(N) are closed based on the assertion of the IN signal, coupling the SP resistors $R_{S1}$-$R_{SN}$ to the sensor electrodes 410(1)-410(N), respectively. As a result of the coupling, each of the SP resistors $R_{S1}$-$R_{SN}$ produces a sensing current ($I_{S1}$-$I_{SN}$) based on a voltage differential between $V_S$ and the voltages at nodes 1-N, respectively. The sensing current ($I_S$) in a given channel may be proportional to $I_{GCBC}$ based on the resistance ($R_{FB}$) of the feedback resistor and the resistance ($R_S$) of the SP resistor coupled to that channel (as shown in Equation 2).

The input device detects changes in a capacitance of the first sensor electrode based at least in part on a second current produced by the first resistor responsive to being coupled between the first node and the first sensor electrode (708). With reference for example to FIGS. 4A and 4B, the sensing currents $I_{S1}$-$I_{SN}$ may discharge the sensor electrodes 410(1)-410(N). Each of the integrator circuits 440(1)-440(N) integrates the current from a respective one of the sensor electrodes 410(1)-410(N) and outputs a respective voltage ($V_{out1}$-$V_{outN}$) based on the integrated charge. As described above with reference to FIG. 3, the output voltages $V_{out1}$-$V_{outN}$ are substantially constant (~VDD/2) when there are no input objects in the sensing region, and may vary (relative to the constant voltage level) in response to changes in the capacitive couplings of the electrodes 410 (1)-410(N). The controller 450 may acquire a capacitive frame based on the charges stored on the feedback capacitors $C_{FB1}$-$C_{FBN}$ (represented by the output voltages $V_{out1}$-$V_{outN}$, respectively) at the end of the input sensing operation. More specifically, because the sensing currents $I_{S1}$-$I_{SN}$ are affected by the capacitances of the sensor electrodes 410(1)-410(N), the controller 450 may detect changes in the capacitances of the sensor electrodes 410(1)-410(N) based on the output voltages $V_{out1}$-$V_{outN}$, respectively.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, implementations have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An input device, comprising:
   a first sensor electrode;
   a current source configured to output a first current;
   a transimpedance amplifier configured to receive the first current from the current source and produce a first voltage based on the first current;
   a first resistor configured to provide a second current to the first sensor electrode based at least in part on the first voltage; and
   a controller configured to detect changes in a capacitance of the first sensor electrode based at least in part on the second current.

2. The input device of claim 1, further comprising:
   switching circuitry configured to selectively couple the first resistor between an output of the transimpedance amplifier and the first sensor electrode based on an operating mode of the input device.

3. The input device of claim 1, wherein the transimpedance amplifier comprises:
   an operational amplifier; and
   a feedback resistor coupled between an output of the operational amplifier and an input of the operational amplifier, the feedback resistor having the same temperature coefficient of resistance (TCR) as the first resistor.

4. The input device of claim 3, further comprising:
   switching configured to selectively couple the input of the operational amplifier to the current source based on an operating mode of the input device.

5. The input device of claim 1, wherein the current source comprises:
a second resistor;
a capacitor coupled to the second resistor; and
first switching circuitry configured to selectively couple the capacitor to one or more voltage sources based on an operating mode of the input device.

6. The input device of claim 5, further comprising:
second switching circuitry configured to selectively couple the first sensor electrode to the one or more voltage sources based on the operating mode of the input device.

7. The input device of claim 1, further comprising:
a first operational amplifier;
first switching circuitry configured to selectively couple a first input of the first operational amplifier to the first sensor electrode based on an operating mode of the input device; and
a first feedback capacitor coupled between the first input of the first operational amplifier and an output of the first operational amplifier, the feedback capacitor being configured to integrate a charge associated with the second current.

8. The input device of claim 7, further comprising:
a second sensor electrode;
a second resistor configured to provide a third current to the second sensor electrode based at least in part on the first voltage;
a second operational amplifier;
second switching circuitry configured to selectively couple a first input of the second operational amplifier to the second sensor electrode based on the operating mode of the input device; and
a second feedback capacitor coupled between the first input of the second operational amplifier and an output of the second operation amplifier, the second feedback capacitor being configured to integrate a charge associated with the third current.

9. The input device of claim 8, further comprising:
third switching circuitry to configured to selectively couple the second resistor between an output of the transimpedance amplifier and the second sensor electrode based on the operating mode of the input device.

10. The input device of claim 8, further comprising:
a noise suppression circuit configured to:
detect a second voltage at the output of the first operational amplifier;
detect a third voltage at the output of the second operational amplifier;
produce a fourth voltage being based at least in part on a sum of the second and third voltages; and
provide the fourth voltage to a respective second input of each of the first and second operational amplifiers.

11. A method of capacitive sensing performed by an input device, comprising:
generating a first current;
converting the first current, through a transimpedance amplifier, to a first voltage at a first node;
selectively coupling a first resistor between the first node and a first sensor electrode based on an operating mode of the input device, the operating mode being one of a first mode or a second mode; and
detecting changes in a capacitance of the first sensor electrode based at least in part on a second current produced by the first resistor responsive to being coupled between the first node and the first sensor electrode.

12. The method of claim 11, wherein the transimpedance amplifier comprises:
an operational amplifier having an output coupled to the first node; and
a feedback resistor coupled between the output and an input of the operational amplifier, the feedback resistor having the same temperature coefficient of resistance (TCR) as the first resistor.

13. The method of claim 11, wherein the selective coupling of the first resistor comprises:
coupling the first resistor to each of the first node and the first sensor electrode based on the input device operating in the first mode; and
decoupling the first resistor from at least one of the first node or the first sensor electrode based on the input device operating in the second mode.

14. The method of claim 13, wherein the generating of the first current comprises:
coupling a capacitor to a voltage source based on the input device operating in the second mode; and
decoupling the capacitor from the voltage source based on the input device operating in the first mode, the first current being produced across a second resistor based on the decoupling of the capacitor from the voltage source.

15. The method of claim 14, further comprising:
coupling the first sensor electrode to the voltage source based on the input device operating in the second mode; and
decoupling the first sensor electrode from the voltage source based on the input device operating in the first mode.

16. The method of claim 13, further comprising:
selectively coupling a first input of a first integrator circuit to the first sensor electrode based on the operating mode of the input device, the first integrator circuit being configured to integrate a charge associated with the second current.

17. The method of claim 16, wherein the selective coupling of the first input of the first integrator circuit comprises:
coupling the first input of the first integrator circuit to the first sensor electrode based on the input device operating in the first mode; and
decoupling the first input of the first integrator circuit from the first sensor electrode based on the input device operating in the second mode.

18. The method of claim 16, further comprising:
selectively coupling a second resistor between the first node and a second sensor electrode based on the operating mode of the input device; and
selectively coupling a first input of a second integrator circuit to the second sensor electrode based on the operating mode of the input device, the second integrator circuit being configured to integrate a charge associated with a third current produced by the second resistor responsive to being coupled between the first node and the second sensor electrode.

19. The method of claim 18, further comprising:
detecting a second voltage produced by the first integrator circuit based on the integration of charge associated with the second current;
detecting a third voltage produced by the second integrator circuit based on the integration of charge associated with the third current;

producing a fourth voltage based at least in part on a sum of the second and third voltages; and providing the fourth voltage to a respective second input of each of the first and second integrator circuits.

20. A baseline correction circuit for an input device, comprising:

a current source configured to produce a first current;

a transimpedance amplifier configured to receive the first current from the current source and produce a sensing voltage based on the first current, the transimpedance amplifier including an operational amplifier and a first resistor coupled between an input and an output of the operational amplifier;

a second resistor having a first terminal coupled to the output of the operational amplifier, the second resistor having the same temperature coefficient of resistance (TCR) as the first resistor; and switching circuitry configured to selectively couple a second terminal of the second resistor to a sensor electrode of the input device so that a second current is produced across the second resistor, based on the sensing voltage, responsive to the second terminal being coupled to the sensor electrode.

* * * * *